United States Patent
Seo et al.

(10) Patent No.: US 7,285,459 B2
(45) Date of Patent: Oct. 23, 2007

(54) FLAT PANEL DISPLAY WITH HIGH CAPACITANCE AND METHOD OF MANUFACTURING THE SAME

(75) Inventors: Seong-Moh Seo, Suwon (KR); Jae-Bon Koo, Suwon (KR)

(73) Assignee: Samsung SDI Co., Ltd., Suwon-si (KR)

(*) Notice: Subject to any disclaimer, the term of this patent is extended or adjusted under 35 U.S.C. 154(b) by 323 days.

(21) Appl. No.: 11/063,730

(22) Filed: Feb. 24, 2005

(65) Prior Publication Data

US 2005/0189578 A1    Sep. 1, 2005

Related U.S. Application Data

(60) Continuation-in-part of application No. 10/857,983, filed on Jun. 2, 2004, now Pat. No. 6,878,584, which is a division of application No. 10/095,111, filed on Mar. 12, 2002, now Pat. No. 6,833,666.

(30) Foreign Application Priority Data

Aug. 6, 2001    (KR) ............... 2001-47334

(51) Int. Cl.
    H01L 21/8244    (2006.01)
    H01L 21/8242    (2006.01)
    H01L 21/339    (2006.01)
    H01L 21/84    (2006.01)
    H01L 51/00    (2006.01)

(52) U.S. Cl. ............. 438/239; 438/238; 438/149; 438/155; 257/40; 257/E51.005; 257/E51.006; 257/E51.007

(58) Field of Classification Search ............... 438/149, 438/155, 238–239; 257/40, E51.005, E51.006, 257/E51.007
See application file for complete search history.

(56) References Cited

U.S. PATENT DOCUMENTS 6,489,176 B2    12/2002    Ninomiya ............ 438/30

(Continued)

FOREIGN PATENT DOCUMENTS

CN    1224887 A    8/1999

(Continued)

OTHER PUBLICATIONS

U.S. Appl. No. 10/095,111, filed Mar. 12, 2002, Seo et al., Samsung SDI Co., Ltd.
U.S. Appl. No. 10/857,983, filed Jun. 2, 2004, Seo et al., Samsung SDI Co., Ltd.

(Continued)

Primary Examiner—Luan Thai
(74) Attorney, Agent, or Firm—Stein, McEwen & Bui, LLP

(57)    ABSTRACT

A flat panel display device having a high capacitance and a high aperture ratio. A thin film transistor and a capacitor are formed on an insulating substrate. The thin film transistor includes a semiconductor layer, a gate electrode and source and drain electrodes. The capacitor has first and second capacitor electrodes and a dielectric layer. An insulating layer is formed over the transistor to insulate the gate electrode from the source and drain electrodes, and a portion of the insulating layer is formed as the dielectric layer between the first and second capacitor electrodes. A non-planar shape of the first capacitor electrode and a conforming shape of the dielectric layer and a second capacitor electrode increase a capacitance of the capacitor. The portion of the insulating layer serving as the capacitor dielectric is formed to be thinner than the portion of the insulating layer formed over the gate electrode.

24 Claims, 15 Drawing Sheets

U.S. PATENT DOCUMENTS 6,660,567 B2 * 12/2003 Choo et al. .................. 438/128
6,770,909 B2 *  8/2004 Murade ....................... 257/59

FOREIGN PATENT DOCUMENTS

| CN | 1245349 A | 2/2000 |
| JP | 2000-269512 | 9/2000 |
| KR | 1999-56771 | 7/1999 |

OTHER PUBLICATIONS

Chinese Office Action issued Oct. 29, 2004 in corresponding Chinese Office Action No. 02156956.8 and English translation.
Office Action issued in Korean Patent Application No. 2001-47334 on Aug. 30, 2006.
Office Action in Korean Patent Application No. 2006-57620 issued on Aug. 30, 2006.

* cited by examiner

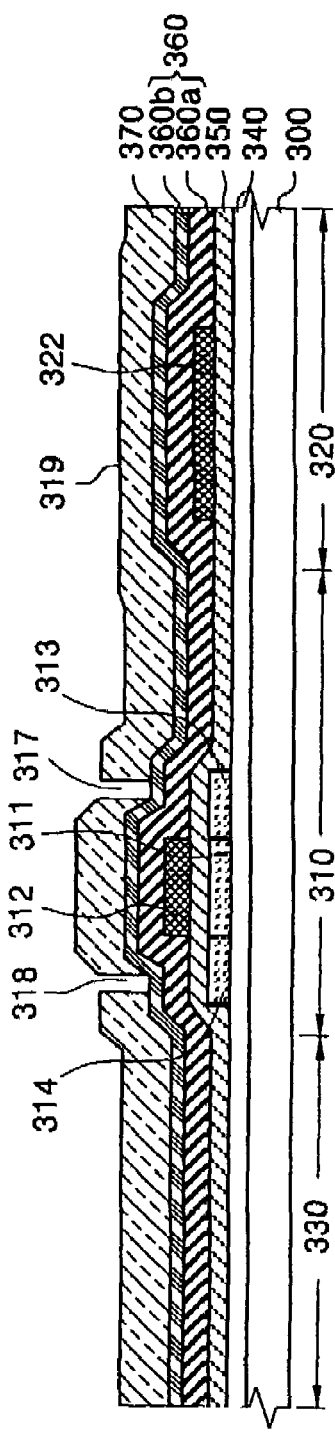
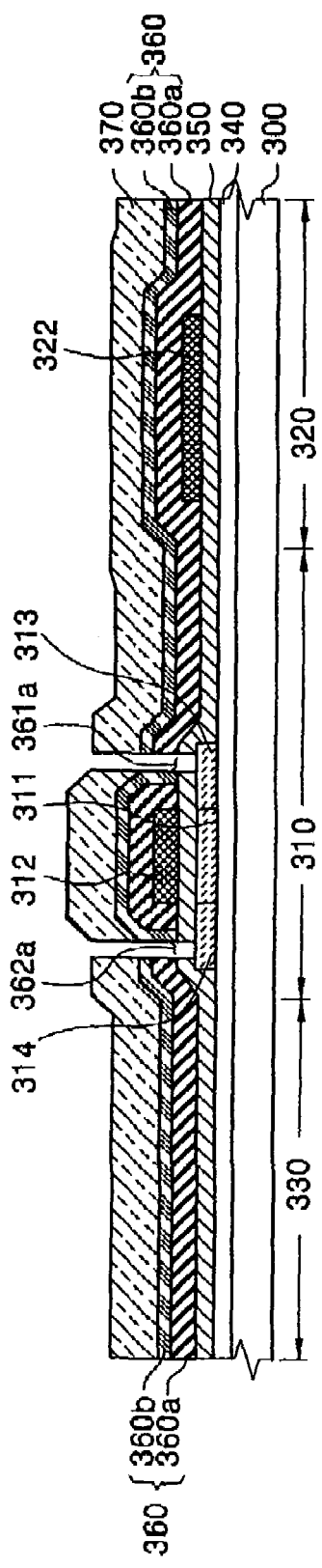

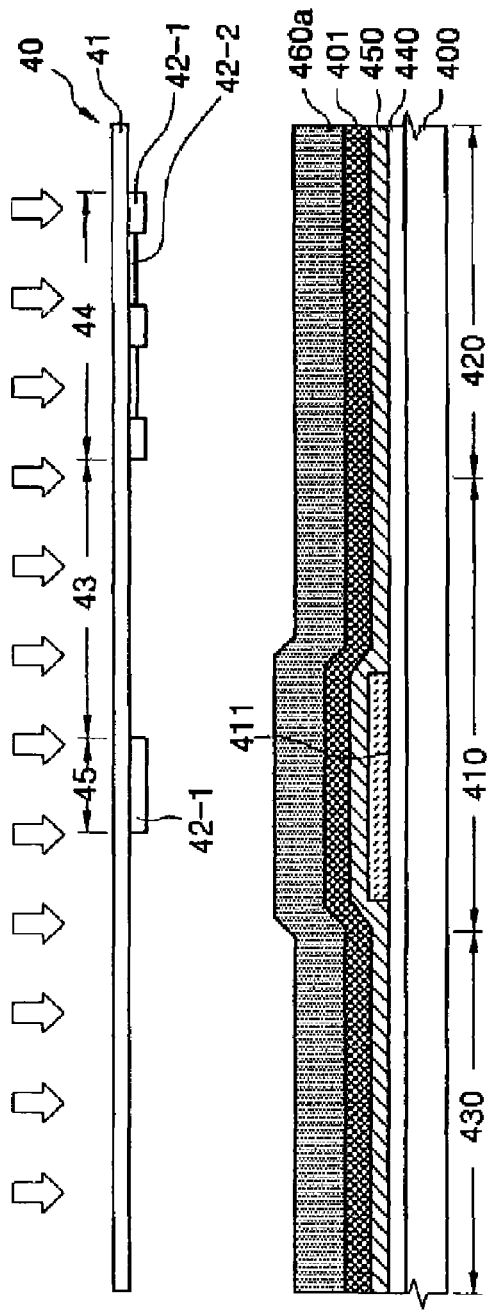

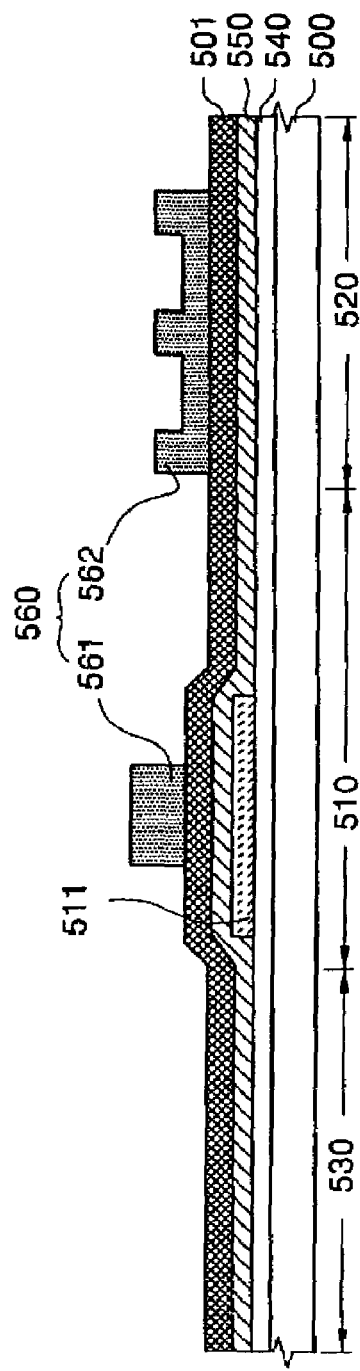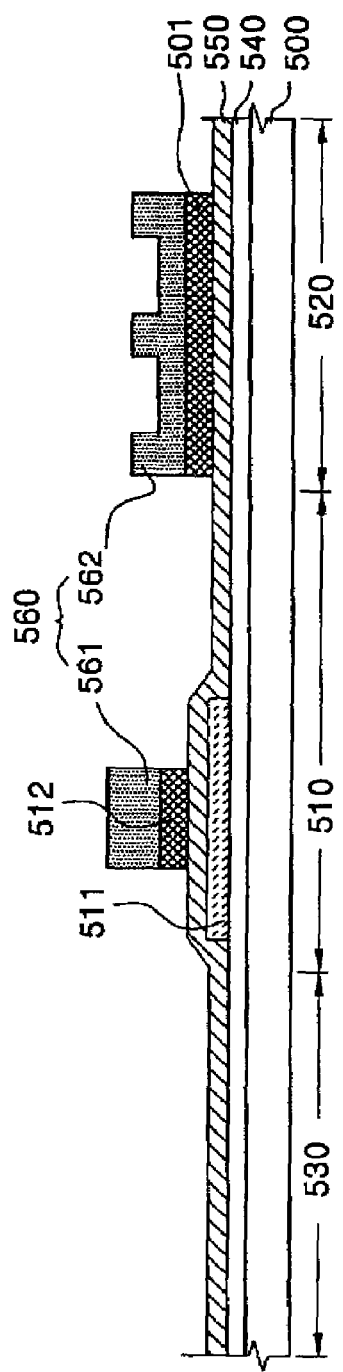

FLAT PANEL DISPLAY WITH HIGH CAPACITANCE AND METHOD OF MANUFACTURING THE SAME

CROSS REFERENCE TO RELATED APPLICATIONS

This application is a continuation-in-part of application Ser. No. 10/857,983 filed on Jun. 2, 2004, now U.S. Pat. No. 6,878,584, which is a divisional of application Ser. No. 10/095,111 filed on Mar. 12, 2002, now U.S. Pat. No. 6,833,666. The contents of application Ser. Nos. 10/857,983 and 10/095,111 are hereby incorporated herein by reference in their entirety.

This application claims the benefit of Korean Application No. 2001-47334 filed Aug. 6, 2001, in the Korean Patent Office, the disclosure of which is incorporated herein by reference.

BACKGROUND OF THE INVENTION

1. Field of the Invention

The present invention relates to a flat panel display device and a method of manufacturing the same.

2. Description of Related Art

A flat panel display device includes a liquid crystal display (LCD), an organic electroluminescent (EL) display, a plasma display panel (PDP), and the like. Of these, the LCD and the organic EL display include a plurality of pixels having a transistor and a capacitor.

A method of increasing a capacitance of the capacitor includes increasing a surface area size of the capacitor, reducing a thickness of a dielectric layer of the capacitor, and using a material having a high dielectric constant as the dielectric layer.

Of these methods of increasing the capacitance of the capacitor, the method of increasing the surface area size of the capacitor reduces an aperture ratio due to an increased capacitor area, and the method of reducing the thickness of the dielectric layer of the capacitor requires an additional process.

Hereinafter, the flat panel display device is described focusing on the organic EL display device.

FIG. 1 is a cross-sectional view illustrating a conventional active matrix organic EL display device. A buffer layer 140 is formed on a transparent insulating substrate 100. The transparent insulating substrate 100 includes first, second and third regions 110, 120 and 130, respectively, and is preferably made of glass. The buffer layer 140 is preferably made of an oxide layer.

A semiconductor layer 111 is formed on the buffer layer 140 over the first region 110. A gate insulating layer 150 is formed over the whole surface of the substrate 100 and covers the semiconductor layer 111.

A first metal layer is deposited on the gate insulating layer 150 and patterned to form a gate electrode 112 and a first capacitor electrode 122. The gate electrode 112 is formed over the first region 110, and the first capacitor electrode 122 is formed over the second region 120.

A p-type impurity or an n-type impurity is ion-doped into the semiconductor layer 111 using the gate electrode 112 as a mask to form source and drain regions 113 and 114.

An interlayer insulating layer 160 is formed over the whole surface of the substrate 100 including the semiconductor layer 111 and the gate electrode 112. The gate insulating layer 150 and the interlayer insulating layer 160 are etched to form contact holes 161 and 162. The contact holes 161 and 162 expose portions of the source and drain regions 113 and 114, respectively.

A second metal layer is deposited on the interlayer insulating layer 160, filling the contact holes 161 and 162. The second metal layer is patterned to form source and drain electrodes 115 and 116 and a second capacitor electrode 126. The source and drain electrodes 115 and 116 contact the source and drain regions 113 and 114 through the contact holes 161 and 162, respectively. The second capacitor electrode 126 extends from the source electrode 115 to cover the first capacitor electrode 122.

A passivation layer 170 is formed over the whole surface of the substrate 100. The passivation layer 170 is etched to expose either of a portion of the source electrode 115 and a portion of the drain electrode 116 so as to form a via hole 171. In FIG. 1, the via hole 171 exposes a portion of the drain electrode 116.

A transparent conductive material layer is deposited on the passivation layer 170, filling the via hole 171. The transparent conductive material layer is patterned to form a pixel electrode 131 over the third region 130 of the substrate 100. The pixel electrode 131 contacts the drain electrode 116 through the via hole 171, and is made of indium tin oxide (ITO) or indium zinc oxide (IZO).

A planarization layer 180 is formed over the whole surface of the substrate 100. The planarization layer 180 is etched to expose a portion of the pixel electrode 131 so as to form an opening portion 181.

An organic EL layer 132 is formed on the pixel electrode 131 to cover the opening portion 181. A cathode electrode 133 is formed to cover the organic EL layer 132. Accordingly, the organic EL display of FIG. 1 is completed.

The interlayer insulating layer 160 serves as both an insulating layer to insulate the gate electrode 112 from the second metal layer and a dielectric layer of the capacitor. Preferably, a portion of the interlayer insulating layer 160 over the first region 110 is relatively thick so as to obtain an excellent insulating characteristic, whereas a portion of the interlayer insulating layer 160 over the second region 120 is relatively thin so as to increase the capacitance of the capacitor. However, forming the relatively thick portion of the interlayer insulating layer 160 and the relatively thin portion of the interlayer insulating layer 160 requires an additional process. Also, an increase of a surface area of the capacitor for a high capacitance causes a reduction of an aperture ratio.

SUMMARY OF THE INVENTION

To overcome the problems described above and/or other problems, the present invention provides a flat panel display device having both a high capacitance of a capacitor and a sufficient insulating characteristic of a thin film transistor (TFT) without requiring an additional process.

It is an aspect of the present invention to provide a flat panel display device having both a high capacitance of a capacitor and a high aperture ratio.

Additional aspects and advantages of the invention will be set forth in part in the description which follows, and, in part, will be obvious from the description, or may be learned by practice of the invention.

In order to achieve the above and other aspects of the invention, the present invention provides a flat panel display device, comprising: a substrate including a thin film transistor region and a capacitor region, the thin film transistor region comprising a thin film transistor having a semiconductor layer, a gate electrode and source and drain electrodes, the capacitor region comprising a capacitor having first and second capacitor electrodes; and an insulating layer formed on the substrate, a portion of the insulating layer formed over the thin film transistor region insulating the gate electrode from the source and drain electrodes, and a portion of the insulating layer formed over the capacitor region used as a dielectric layer between the first capacitor electrode and the second capacitor electrode, the portion of the insulating layer formed over the thin film transistor region is formed of at least double layers and the portion of the insulating layer and the portion of the insulating layer formed over the capacitor region used as a dielectric layer between the first capacitor electrode and the second capacitor electrode is formed of single layer.

The present invention further provides a flat panel display device, comprising: a substrate including a thin film transistor region and a capacitor region; a semiconductor layer formed on the thin film transistor region of the substrate; a gate insulating layer formed over the whole surface of the substrate and covering the semiconductor layer; a gate electrode formed on the gate insulating layer over the thin film transistor region of the substrate; a first capacitor electrode formed on the gate insulating layer over the capacitor region of the substrate; an interlayer insulating layer formed over the whole surface of the substrate and covering the gate electrode and the first capacitor electrode, a portion of the interlayer insulating layer formed over the gate electrode is formed of at least double layer and a portion of the insulating layer formed over the first capacitor electrode is formed of single layer, the interlayer insulating layer having contact holes exposing both end portions of the semiconductor layer; source and drain electrodes formed on the interlayer insulating layer and contacting the end portions of the semiconductor layer through the contact holes, respectively; and a second capacitor electrode formed on the interlayer insulating layer over the capacitor region and electrically connected to either of the source and drain electrodes.

The present invention further provides a method of manufacturing a flat panel display device, comprising: providing a substrate, the substrate including a thin film transistor region and a capacitor region; forming a semiconductor layer over the thin film transistor region of the substrate; forming a gate insulating layer over the whole surface of the substrate to cover the semiconductor layer; forming a gate electrode and a first capacitor electrode on the gate insulating layer, the gate electrode formed over the thin film transistor region, the first capacitor electrode formed over the capacitor region; forming an interlayer insulating layer as at least double layers over the whole surface of the substrate to cover the gate electrode and the first capacitor electrode; and etching the interlayer insulating layer using a half-tone mask, a portion of the interlayer insulating layer over the thin film transistor region etched to expose both end portions of the semiconductor layer, a portion of the interlayer insulating layer over the capacitor region etched by a predetermined thickness to remove a upper layer of the double layer.

The present invention further provides a method of manufacturing a flat panel display device, comprising: providing a substrate, the substrate including a thin film transistor region and a capacitor region; forming a semiconductor layer over the thin film transistor region of the substrate; forming a gate insulating layer over the whole surface of the substrate to cover the semiconductor layer; forming a gate electrode and a first capacitor electrode on the gate insulating layer, the gate electrode formed over the thin film transistor region, the first capacitor electrode formed over the capacitor region; forming an interlayer insulating layer over the whole surface of the substrate to cover the gate electrode and the first capacitor electrode; coating a photoresist on the interlayer insulating layer; patterning the photoresist using a half-tone mask to form first and second photoresist patterns, the first photoresist pattern formed over the thin film transistor region and exposing both end portions of the semiconductor layer, the second photoresist pattern formed over the capacitor region and being thinner than the first photoresist pattern; etching exposed portion of the interlayer insulating layer using the first and second photoresist patterns to form contact holes; ashing the photoresist patterns to expose a portion of the interlayer insulating layer over the capacitor region; and etching the exposed portion of the interlayer insulating layer over the capacitor region using the remaining photoresist patterns, wherein a portion of the interlayer insulating layer over the thin film transistor region is formed of at least double layers and a portion of the interlayer insulating layer over the capacitor region is formed of single layer.

The present invention further provides a flat panel display device, comprising: a substrate including a thin film transistor region and a capacitor region; a thin film transistor formed over the thin film transistor region including a semiconductor layer, a gate electrode, and source and drain electrodes; an interlayer insulating layer formed over the whole substrate and a capacitor including first and second capacitor electrodes, the first capacitor electrode having step portions, wherein the portion of the interlayer insulating layer formed over the thin film transistor region is formed of at least double layers and the portion of the insulating layer and the portion of the interlayer insulating layer formed over the capacitor region used as a dielectric layer between the first capacitor electrode and the second capacitor electrode is formed of single layer.

The present invention further provides a flat panel display device, comprising: a substrate including a thin film transistor region and a capacitor region; a semiconductor layer formed on the thin film transistor region of the substrate; a gate insulating layer formed over the whole surface of the substrate and covering the semiconductor layer; a gate electrode formed on the gate insulating layer over the thin film transistor region of the substrate; a first capacitor electrode formed on the gate insulating layer over the capacitor region of the insulating substrate and having step portions; an interlayer insulating layer formed over the whole surface of the substrate and covering the gate electrode and the first capacitor electrode and having contact holes; source and drain electrodes formed on the interlayer insulating layer and contacting the end portions of the semiconductor layer through the contact holes, respectively; and a second capacitor electrode formed on the interlayer insulating layer over the capacitor region and electrically connected to either of the source and drain electrodes, wherein the portion of the interlayer insulating layer formed over the thin film transistor region is formed of at least double layers and the portion of the insulating layer and the portion of the interlayer insulating layer formed over the capacitor region used as a dielectric layer between the first capacitor electrode and the second capacitor electrode is formed of single layer.

The present invention further provides a method of manufacturing a flat panel display device, comprising: providing a substrate, the substrate having a thin film transistor region and a capacitor region; forming a semiconductor layer over the thin film transistor region; forming a gate insulating layer over the whole surface of the substrate to cover the semiconductor layer; depositing a metal layer on the gate insulating layer; etching the metal layer using a half-tone mask to form a gate electrode over the thin film transistor region and to form a first capacitor electrode having step portions; forming an interlayer insulating layer as at least double layers over the whole surface of the substrate and covering the gate electrode and the first capacitor electrode; and etching the interlayer insulating layer using a half-tone mask, a portion of the interlayer insulating layer over the thin film transistor region etched to expose both end portions of the semiconductor layer, a portion of the interlayer insulating layer over the capacitor region etched by a predetermined thickness to remove a upper layer of the double layer.

The present invention further provides a method of manufacturing a flat panel display device, comprising: providing a substrate, the substrate including a thin film transistor region and a capacitor region; forming a semiconductor layer over the thin film transistor region of the substrate; forming a gate insulating layer over the whole surface of the substrate to cover the semiconductor layer; depositing a metal layer on the gate insulating layer; coating a photoresist on the metal layer; patterning the photoresist using a half-tone mask to form first and second photoresist patterns, the first photoresist pattern formed over the thin film transistor region and exposing a portion of the gate insulating layer, the second photoresist pattern formed over the capacitor region and having step portions; etching the metal layer using the first and second photoresist patterns to form a gate electrode; ashing the photoresist patterns to expose a portion of the metal layer over the capacitor region; and etching the exposed portion of the metal layer over the capacitor region using the remaining photoresist patterns to form a first capacitor electrode having step portions, wherein a portion of the interlayer insulating layer over the thin film transistor region is formed of at least double layers and a portion of the interlayer insulating layer over the capacitor region is formed of single layer. Preferably, the first capacitor electrode has grooves in the form of a stripe or a dot and each groove has a rectangular cross-section, a triangle cross-section, trapezoid cross-section, or a wave-shaped cross-section.

BRIEF DESCRIPTION OF THE DRAWINGS

For a more complete understanding of the present invention and the advantages thereof, reference is now made to the following descriptions taken in conjunction with the accompanying drawings in which:

FIGS. 3A through 3E are cross-sectional views illustrating a process of manufacturing an organic EL display according to a second embodiment of the present invention;

FIGS. 4A through 4E are cross-sectional views illustrating a process of manufacturing an organic EL display according to a third embodiment of the present invention;

FIGS. 5A through 5E are cross-sectional views illustrating a process of manufacturing an organic EL display according to a fourth embodiment of the present invention;

DESCRIPTION OF THE PREFFERED EMBODIMENTS

Figure 1:
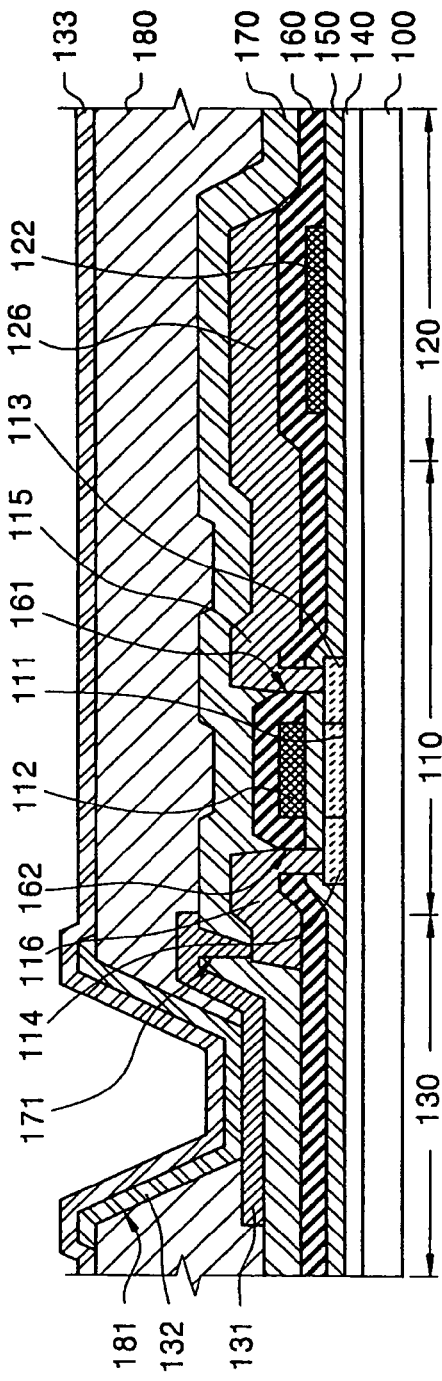
FIG. 1 is a cross-sectional view illustrating a conventional active matrix organic EL display device.

Reference will now be made in detail to the present embodiments of the present invention, examples of which are illustrated in the accompanying drawings, wherein like reference numerals refer to like elements throughout.

Hereinafter, a flat panel display device according to the present invention is described focusing on an organic EL display device.

FIGS. 2A through 2D are cross-sectional views illustrating a process of manufacturing an organic EL display according to a first embodiment of the present invention.

Figure 2A:
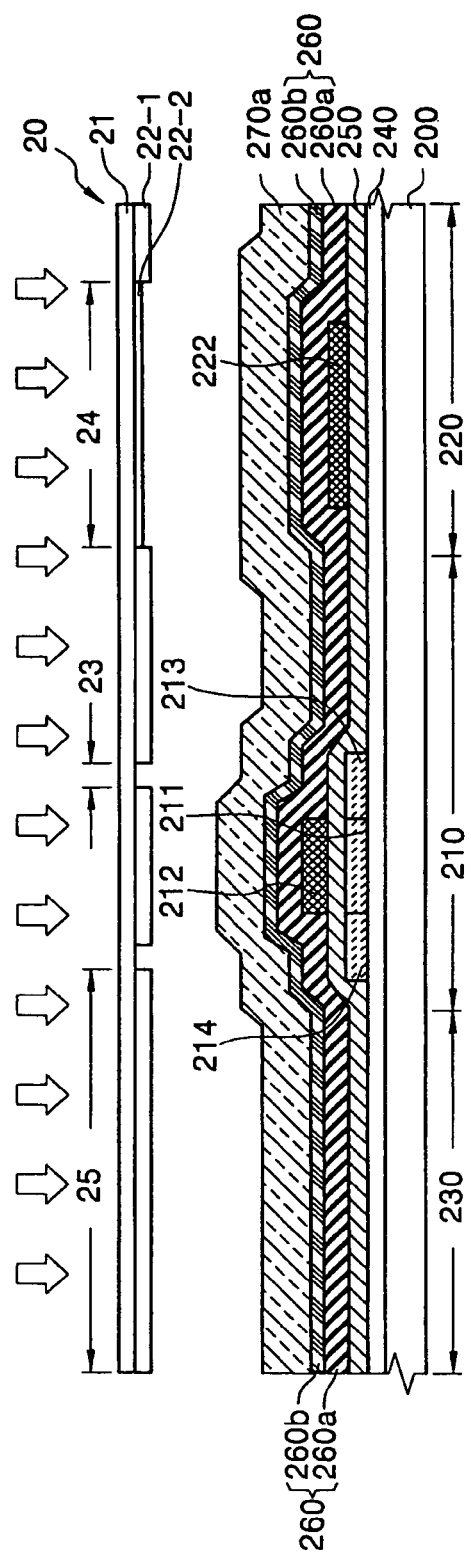
FIGS. 2A through 2D are cross-sectional views illustrating a process of manufacturing an organic EL display according to a first embodiment of the present invention.

Referring to FIG. 2A, a buffer layer 240 is formed on a transparent insulating substrate 200. The transparent insulating substrate 200 comprises first, second and third regions 210, 220 and 230, and is preferably made of glass. The buffer layer 240 is preferably made of an oxide layer.

A semiconductor layer 211 is formed on the buffer layer 240 over the first region 210. The semiconductor layer 211 is preferably made of poly silicon. A gate insulting layer 250 is formed over the whole surface of the substrate 200 and covers the semiconductor layer 211.

A first metal layer is deposited on the gate insulating layer 250 and patterned to form a gate electrode 212 and a first capacitor electrode 222. The gate electrode 212 is formed over the first region 210, and the first capacitor electrode 222 is formed over the second region 220.

A p-type or an n-type impurity is ion-doped into the semiconductor layer 211 using the gate electrode 212 as a mask to form source and drain regions 213 and 214, respectively. An interlayer insulating layer 260 is formed over the whole surface of the substrate 200. The interlayer insulating layer 260 is made of at least two layers, a lower layer 260a and an upper layer 260b. And then, the upper layer 260b of the interlayer insulating layer 260 on the second region 220 is removed. Accordingly, one layer of the interlayer insulating layer 260 remains on the second region 220.

A photoresist 270a is coated on the interlayer insulating layer 260, and then a mask 20 is aligned.

The mask 20 comprises a light transmitting portion 23, a semi-transmitting portion 24, and a light shielding portion 25. The light transmitting portion 23 transmits all of incident light. The semi-transmitting portion 24 is a half-tone portion and transmits part of incident light. The light shielding portion 25 shields all of incident light.

The light shielding portion 25 comprises a light shielding material layer 22-1 formed on the transparent substrate 21 made of, e.g., quartz. The light shielding material layer 22-1 has a thickness sufficient to perfectly shield all of incident light. The semi-transmitting portion 24 comprises a light shielding material layer 22-2 formed on the transparent substrate 21. The light shielding material layer 22-2 has a thickness sufficient to transmit part of incident light. An amount of light to be transmitted by the semi-transmitting portion 24 depends on a thickness of the interlayer insulating layer 260 to be etched in a subsequent process and the amount of transmitted light is controlled by the thickness of the light shielding material layer 22-2.

The light transmitting portion 23 comprises portions of the transparent substrate 21 which are free of light shielding material layers 22-1 and 22-2 and is arranged with respective portions over the source and drain regions 213 and 214. The semi-transmitting portion 24 is arranged over the first capacitor electrode 222. The light shielding material layers 22-1 and 22-2 are preferably made of chromium (Cr).

Figure 2B:
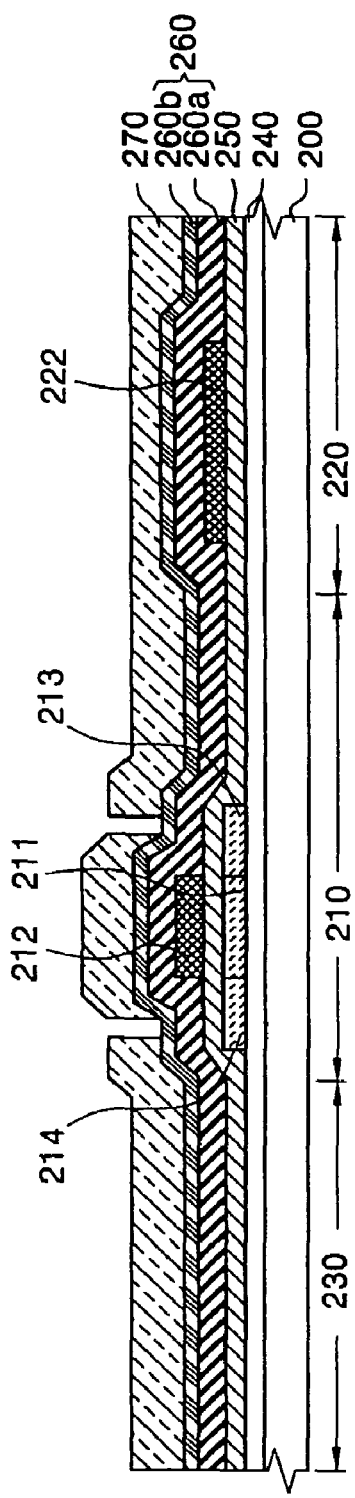

Referring to FIG. 2B, the photoresist 270a (FIG. 2A) is subject to a light exposure (indicated by arrows L in FIG. 2A) using the mask 20 to form a photoresist pattern 270. Portions 217 and 218 of the photoresist 270a corresponding to the light transmitting portion 23 are removed, and a portion of the photoresist 270a corresponding to the semi-transmitting portion 24 is removed so that an area 219 has a relatively thin thickness.

Figure 2C:
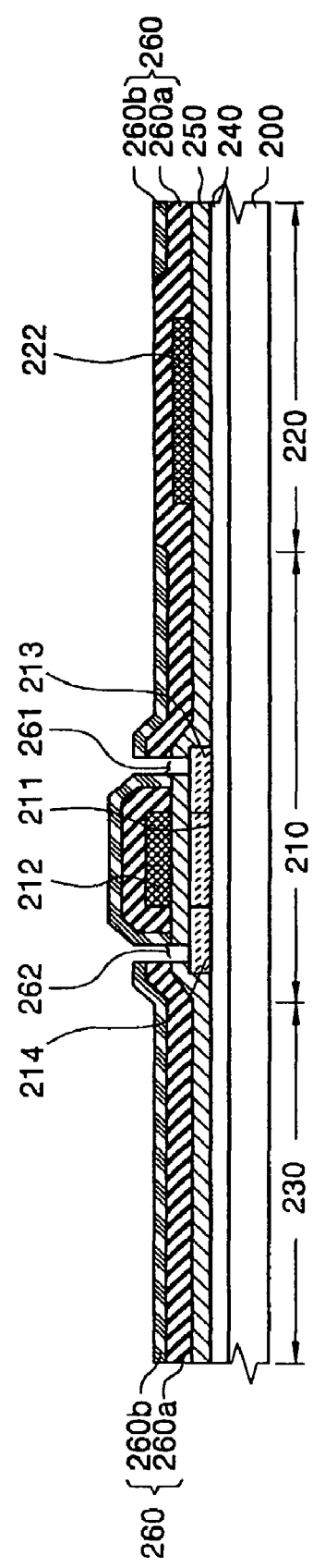

Referring to FIG. 2C, the gate insulating layer 250 and the interlayer insulating layer 260 are etched using the photoresist pattern 270 as a mask to form contact holes 261 and 262. The contact holes 261 and 262 expose portions of the source and drain regions 213 and 214, respectively. During this etching process, an erosion of the photoresist pattern 270 occurs, and exposed portions (upper layer 260b) of the interlayer insulating layer 260 are etched. As a result, a portion 227 of the interlayer insulating layer 260 corresponding to the first capacitor electrode 222 has single layer of the lower layer 260a by removing the upper layer 260b.

Figure 2D:
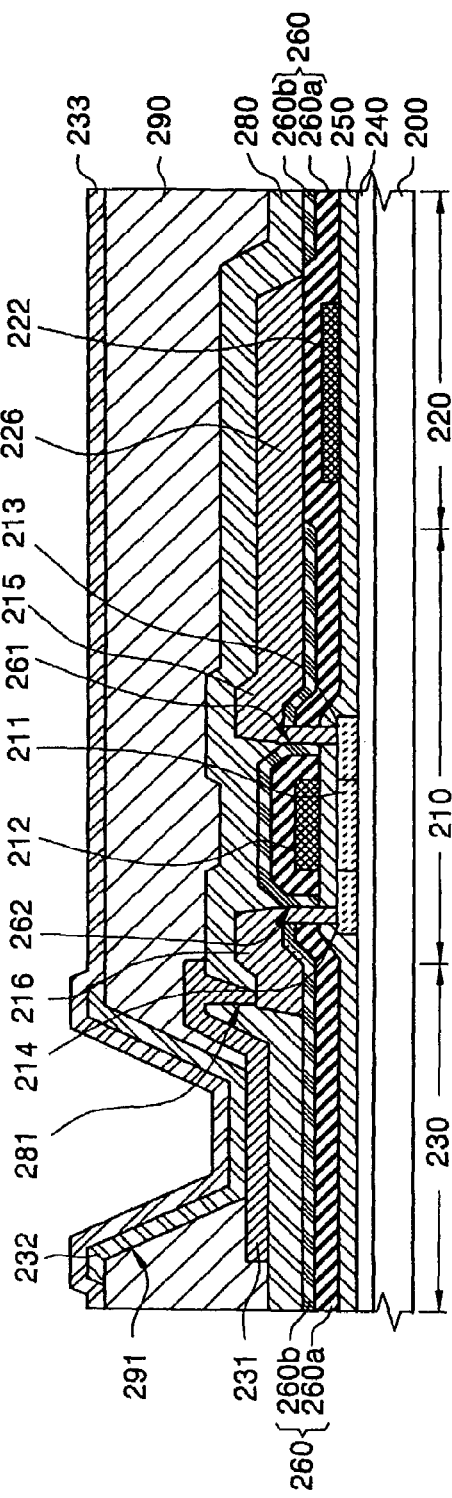

Referring to FIG. 2D, a second metal layer is deposited on the interlayer insulating layer 260. The second metal layer fills the contact holes 261 and 262 and is patterned to form source and drain electrodes 215 and 216 and a second capacitor electrode 226. The source and drain electrodes 215 and 216 contact the source and drain regions 213 and 214 through the contact holes 261 and 262, respectively. The second capacitor electrode 226 extends from the source electrode 215 to cover the first capacitor electrode 222.

A passivation layer 280 is formed over the source and drain electrodes 215 and 216, respectively, the second capacitor electrode 226 remaining portions of the interlayer insulating layer 260. The passivation layer 280 is etched to expose either a portion of the source electrode 215 or a portion of the drain electrode 216 so as to form a via hole 281. In FIG. 2D, the via hole 281 exposes a portion of the drain electrode 216.

A transparent conductive material layer is deposited on the passivation layer 280, filling the via hole 281. The transparent conductive layer is patterned to form a pixel electrode 231 over the third region 230 of the substrate 200. The pixel electrode 231 contacts the drain electrode 216 through the via hole 281, and is made of indium tin oxide (ITO) or indium zinc oxide (IZO).

A planarization layer 290 is formed over the whole surface of the substrate 200 and covers the pixel electrode 231 and portions of the passivation layer 280. The planarization layer 290 is etched to expose a portion of the pixel electrode 231 so as to form an opening portion 291.

An organic EL layer 232 is formed on the pixel electrode 231 to cover the opening portion 291. A cathode electrode 233 is formed to cover the organic EL layer 232. Accordingly, the organic EL display according to the first embodiment of the present invention is completed.

FIGS. 3A through 3E are cross-sectional views illustrating a process of manufacturing an organic EL display according to a second embodiment of the present invention.

Figure 3A:
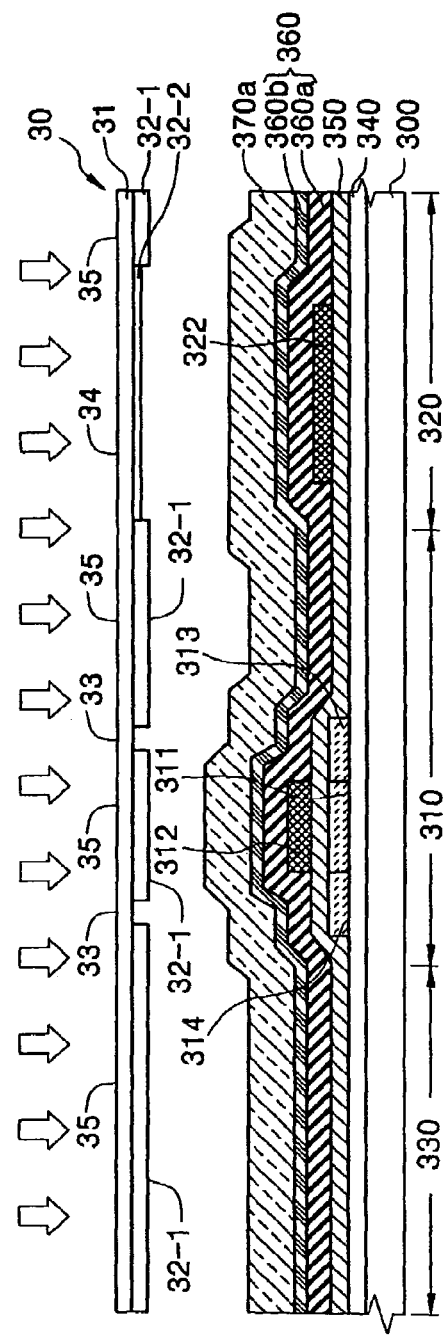

Referring to FIG. 3A, a buffer layer 340 is formed on a transparent insulating substrate 300. The transparent insulating substrate 300 comprises first, second and third regions 310, 320 and 330 and is preferably made of glass. The buffer layer 340 is preferably made of an oxide layer.

A semiconductor layer 311 is formed on the buffer layer 340 over the first region 310. The semiconductor layer 311 is preferably made of poly silicon. A gate insulating layer 350 is formed over the whole surface of the substrate 300 and covers the semiconductor layer 311.

A first metal layer is deposited on the gate insulating layer 350 and patterned to form a gate electrode 312 and a first capacitor electrode 322. The gate electrode 312 is formed over the first region 310, and the first capacitor electrode 322 is formed over the second region 320.

A p-type or an n-type impurity is ion-doped into the semiconductor layer 311 using the gate electrode 312 as a mask to form source and drain regions 313 and 314.

An interlayer insulating layer 360 is formed over the whole surface of the substrate 100 and covers the gate electrode 312, the first capacitor electrode 322 and portions of the gate insulating layer 350. The interlayer insulating layer 360 is made of at least two layers, a lower layer 360a and an upper layer 360b.

A photoresist 370a is coated on the interlayer insulating layer 360, and then a mask 30 is aligned.

The mask 30 comprises a light transmitting portion 33, a semi-transmitting portion 34, and a light shielding portion 35. The light transmitting portion 33 transmits all of incident light. The semi-transmitting portion 34 is a half-tone portion and transmits part of incident light. The light shielding portion 35 shields all of incident light.

The light shielding portion 35 comprises a light shielding material layer 32-1 formed on a transparent substrate 31 made of, e.g., quartz. The light shielding material layer 32-1 has a thickness sufficient to perfectly shield all of incident light. The semi-transmitting portion 34 comprises a light shielding material layer 32-2 formed on the transparent substrate 31. The light shielding material layer 32-2 has a thickness sufficient to transmit part of incident light. An amount of light to be transmitted by the semi-transmitting portion 34 depends on a thickness of the interlayer insulating layer 360 to be etched in a subsequent process and the amount of transmitted light is controlled by the thickness of the light shielding material layer 22-2.

The light transmitting portion 33 comprises portions of the transparent substrate 31 which are free of light shielding material layers 32-1 and 32-2 and is arranged with respective portions over the source and drain regions 313 and 314. The semi-transmitting portion 34 is arranged over the first capacitor electrode 322. The light shielding material layers 32-1 and 32-2 are preferably made of chromium (Cr).

Referring to FIG. 3B, the photoresist 370a (FIG. 3A) is subject to a light exposure (indicated by arrows L in FIG. 3A) using the mask 30 to form a photoresist pattern 370. Portions 317 and 318 of the photoresist 370a corresponding to the light transmitting portion 33 are removed, and a portion 319 of the photoresist 370a corresponding to the semi-transmitting portion 34 is removed so that an area 319 has a relatively thin thickness.

Referring to FIG. 3C, the interlayer insulating layer 360 is etched using the photoresist pattern 370 as a mask to form pre-contact holes 361a and 362a. This etching process is performed using a recipe that does not cause an erosion of the photoresist pattern 370a, whereupon the photoresist pattern 370 remains "as is".

Figure 3D:
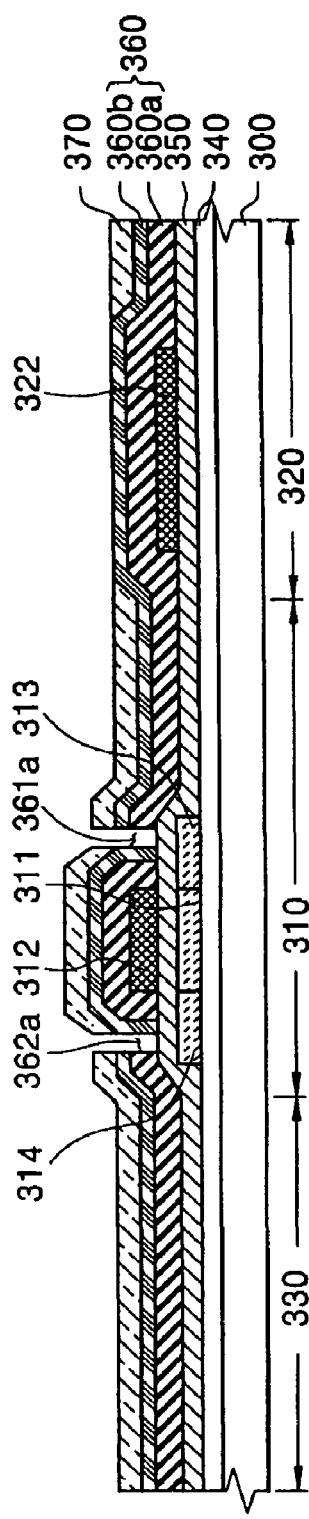

Referring to FIG. 3D, an ashing process is performed to remove a portion of the photoresist pattern 370 until the upper layer 360b of the interlayer insulating layer 360 over the second region 320 of the substrate 300 is exposed in an area 329.

Figure 3E:
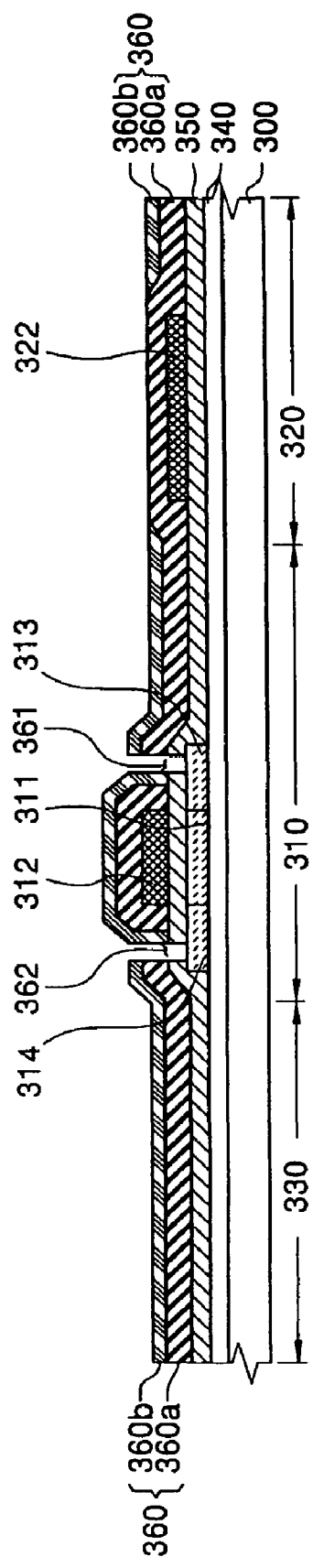

Referring to FIG. 3E, an etching process is performed using the remaining photoresist pattern 370 as a mask, so that the upper layer 360b of the interlayer insulating layer 360 on the region 329 is removed and the lower layer 360a of the interlayer insulating layer 360 on the region 329 remains and contact holes 361 and 362 are formed.

Accordingly, a portion 339 of the interlayer insulating layer 360 over the first capacitor electrode 322 has a relatively thinner thickness than regions 310 and 330.

The contact holes 361 and 362 expose portions of the source and drain regions 313 and 314, respectively. The etching process which forms the contact holes 361 and 362 is performed using a recipe having an excellent etching selectivity to the poly silicon semiconductor layer 311. Thereafter, the remaining photoresist pattern 370 is removed.

A process subsequent to the process described with respect to FIG. 3E is identical to the process described with respect to FIG. 2D, and a description thereof is omitted to avoid a redundancy.

According to the first and second embodiments of the present invention, a portion of the interlayer insulating layer for insulating the gate electrode is formed to a relatively thick thickness, and a portion of the interlayer insulating layer serving as a dielectric layer is formed to a relatively thin thickness. Accordingly, a sufficient insulating characteristic between the gate electrode and the source and drain electrodes is achieved, and a capacitor having a high capacitance is obtained using the relatively thin portion as the dielectric layer.

FIGS. 4A through 4D are cross-sectional views illustrating a process of manufacturing an organic EL display according to a third embodiment of the present invention.

Referring to FIG. 4A, a buffer layer 440 is formed on a transparent insulating substrate 400. The transparent insulating substrate 400 comprises first, second and third regions 410, 420 and 430 and is preferably made of a transparent material such as, e.g., glass. The buffer layer 440 is preferably made of an oxide layer.

A semiconductor layer 411 is formed on the buffer layer 440 over the first region 410. The semiconductor layer 411 is preferably made of poly silicon. A gate insulating layer 450 is formed over the whole surface of the substrate 400 and covers the semiconductor layer 411 and the buffer layer 440.

A first metal layer 401 is deposited on the gate insulating layer 450. A photoresist 460a is coated on the first metal layer 401, and then a mask 40 is aligned.

The mask 40 is a half-tone mask and comprises a light transmitting portion 43, a semi-transmitting portion 44, and a light shielding portion 45. The light transmitting portion 43 transmits all of incident light. The semi-transmitting portion 44 is a half-tone portion and transmits part of incident light. The light shielding portion 45 shields all of incident light.

The light shielding portion 45 comprises a light shielding material layer 42-1 formed on the transparent substrate 41. The transparent substrate 41 is made of a transparent material, e.g., quartz. The light shielding material layer 42-1 is arranged at locations corresponding to a gate electrode and portions of a capacitor electrode which will be formed subsequently, and has a thickness sufficient to perfectly shield all of incident light. The semi-transmitting portion 44 comprises a light shielding material layer 42-2 formed on the transparent substrate 41. The light shielding material layer 42-2 is arranged at a location corresponding to a first capacitor electrode which will be formed subsequently, and has a thickness sufficient to transmit part of incident light. The light shielding material layers 42-1 and 42-2 are preferably made of chromium (Cr). The light transmitting portion 43 comprises portions of the transparent substrate 41 which are free of light shielding material layers 42-1 and 42-2.

A portion of the mask 40 over the second region 420 of the substrate 400 has portions of the partially transmitting light shielding material layer 42-2 formed between portions of the light shielding material layer 42-1.

Referring to FIG. 4B, the photoresist 460a (FIG. 4A) is subject to a light exposure (indicated by arrows L in FIG. 4A) using the mask 40 to form a photoresist pattern 460. The photoresist pattern 460 comprises a first photoresist pattern 461 and a second photoresist pattern 462. The first photoresist pattern 461 is used to form a gate electrode, and the second photoresist pattern 462 is used to form a first capacitor electrode. The second photoresist pattern 462 also has step portions 465. A portion 467 of the second photoresist pattern 462 corresponding to the light shielding material layer 42-1 has a relatively thick thickness, and a portion 469 of the second photoresist pattern 462 corresponding to the light shielding material layer 42-2 has a relatively thin thickness.

Figure 4C:
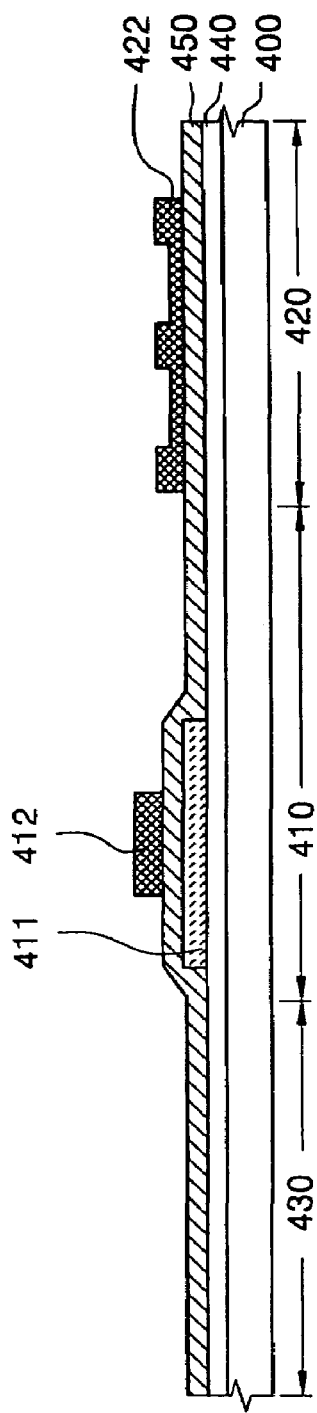

Referring to FIG. 4C, the first metal layer 401 is patterned by the photoresist pattern 460 to form a gate electrode 412 and a first capacitor electrode 422. The gate electrode 412 is formed over the first region 410, and the first capacitor electrode 422 is formed over the second region 420. The first capacitor electrode 422 has a plurality of step portions 425 which transition between relatively thick portions 427 and relatively thin portions 429 and thus the first capacitor electrode 422 has an increased surface area size compared with a capacitor electrode of similar area formed without the step portions 425.

Figure 4D:
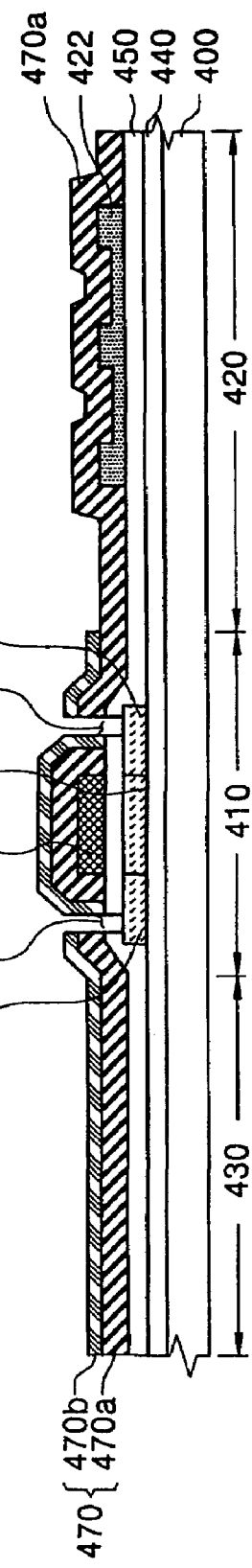

Referring to FIG. 4D, a p-type or an n-type impurity is ion-doped into the semiconductor layer 411 using the gate electrode 412 as a mask to form source and drain regions 413 and 414, respectively.

An interlayer insulating layer 470 made of at least two layers 470a and 470b is formed over the whole surface of the substrate 400 to cover the gate electrode 412, the capacitor electrode 422 and portions of the gate insulating layer 450. The gate insulating layer 450 and the interlayer insulating layer 470 are etched to form contact holes 471 and 472 on the region 410 and the upper layer 470b of the interlayer insulating layer 470 on the region 420 is removed. The contact holes 471 and 472 expose portions of the source and drain regions 413 and 414, respectively.

Figure 4E:
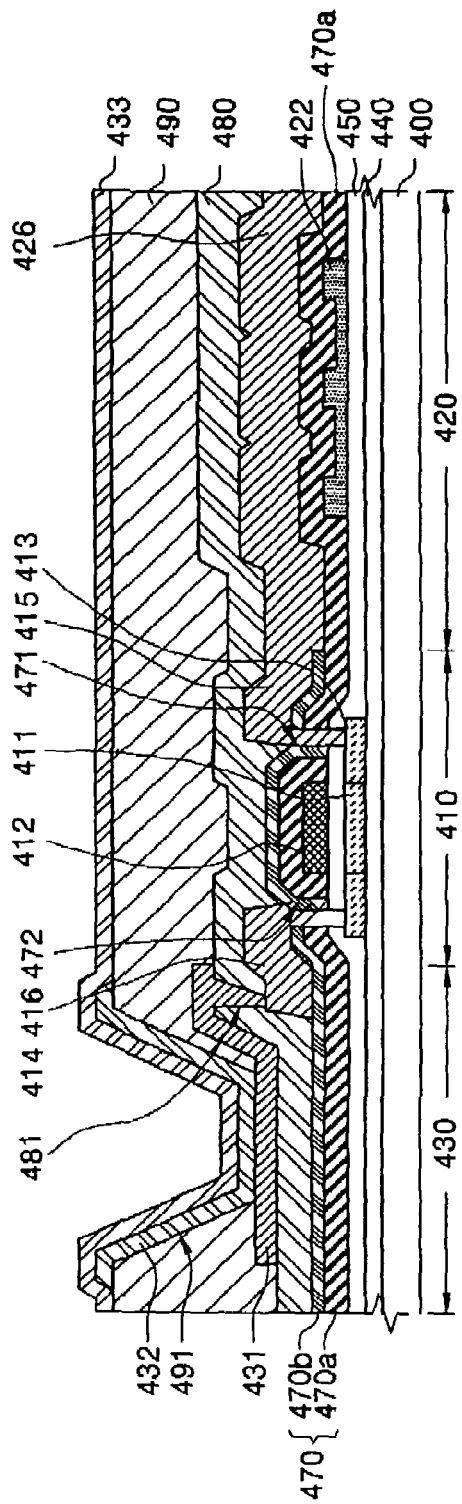

Referring to FIG. 4E, a second metal layer is deposited on the upper layer 470b of the interlayer insulating layer 470 on the regions 410 and 430, and the lower layer 470a of the interlayer insulating layer 470 on the region 420 and filling the contact holes 471 and 472. The second metal layer is patterned to form source and drain electrodes 415 and 416 and a second capacitor electrode 426. The source and drain electrodes 415 and 416 contact the source and drain regions 413 and 414 through the contact holes 471 and 472, respectively. The second capacitor electrode 426 extends from the source electrode 415 to cover the first capacitor electrode 422. The second capacitor electrode 426 is spaced apart from the first capacitor electrode 422 by a portion of the interlayer insulating layer 470.

A passivation layer 480 is formed over the whole surface of the substrate 400. The passivation layer 480 is etched to expose either a portion of the source electrode 415 or a portion of the drain electrode 416 so as to form a via hole 481. In FIG. 4E, the via hole 481 exposes a portion of the drain electrode 416.

A transparent conductive material layer is deposited on the passivation layer 480, filling the via hole 481. The transparent conductive material layer is patterned to form a pixel electrode 431 over the third region 430 of the substrate 400. The pixel electrode 431 contacts the drain electrode 416 through the via hole 481, and is made of indium tin oxide (ITO) or indium zinc oxide (IZO).

A planarization layer 490 is formed over the whole surface of the substrate 400. The planarization layer 490 is etched to expose a portion of the pixel electrode 431 so as to form an opening portion 491.

An organic EL layer 432 is formed on the pixel electrode 431 to cover the opening portion 491. A cathode electrode 433 is formed to cover the organic EL layer 432. Accordingly, the organic EL display according to the third embodiment of the present invention is completed.

FIGS. 5A through 5E are cross-sectional views illustrating a process of manufacturing an organic EL display according to a fourth embodiment of the present invention.

Figure 5A:
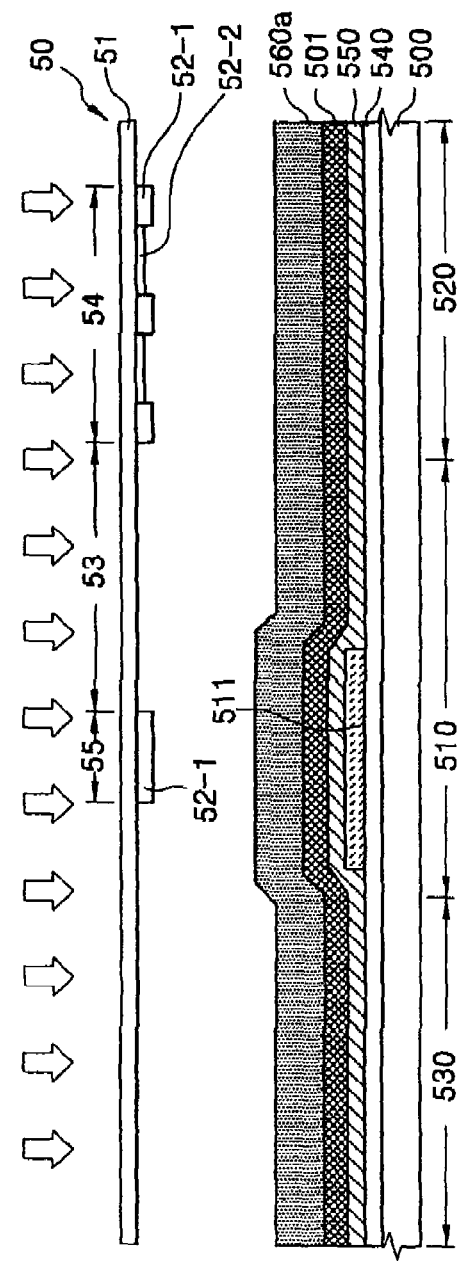

Referring to FIG. 5A, a buffer layer 540 is formed on a transparent insulating substrate 500. The transparent insulating substrate 500 comprises first, second and third regions 510, 520 and 530, and is preferably made of glass. The buffer layer 540 is preferably made of an oxide layer.

A semiconductor layer 511 is formed on the buffer layer 540 over the first region 510. The semiconductor layer 511 is preferably made of poly silicon. A gate insulting layer 550 is formed over the whole surface of the substrate 500 and covers the semiconductor layer 511.

A first metal layer 501 is deposited on the gate insulating layer 550. A photoresist 560a is coated on the first metal layer 501, and then the mask 40 is aligned. The mask 40 is described above with reference to FIG. 4A.

Referring to FIG. 5B, the photoresist 560a (FIG. 5A) is subject to a light exposure (indicated by arrows L in FIG. 5A) using the mask 40 to form a photoresist pattern 560. The photoresist pattern 560 comprises a first photoresist pattern 561 and a second photoresist pattern 562. The first photoresist pattern 561 is used to form a gate electrode, and the second photoresist pattern 562 is used to form a first capacitor electrode. The second photoresist pattern 562 has step portions 565. A portion 567 of the second photoresist pattern 562 corresponding to the light shielding material layer 42-1 has a relatively thick thickness, and a portion 569 of the second photoresist pattern 562 corresponding to the light shielding material layer 42-2 has a relatively thin thickness.

Referring to FIG. 5C, the first metal layer 501 is etched using the photoresist pattern 560 to form a gate electrode 512, also leaving a portion 522a of the first metal layer 501. Etching of the first metal layer 501 is performed using a recipe that does not cause an erosion of the photoresist pattern 560.

Figure 5D:
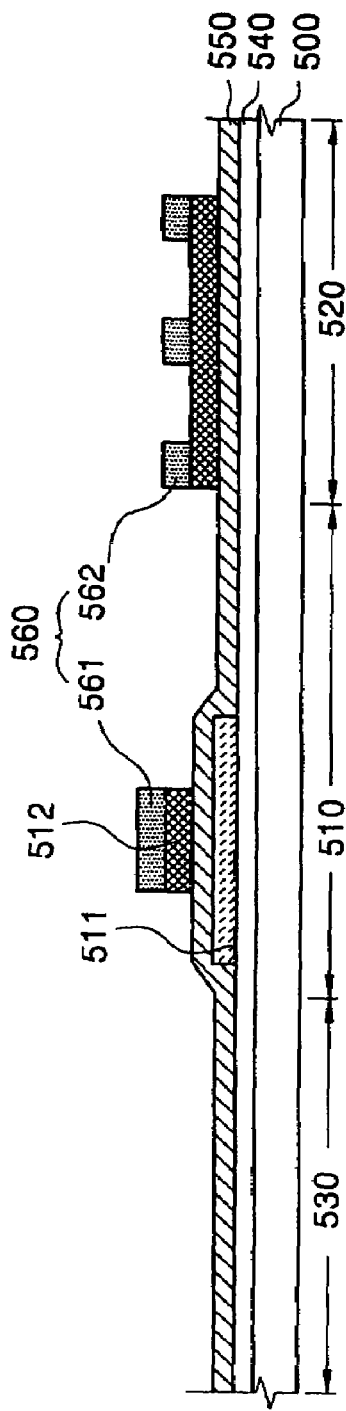
Figure 5E:
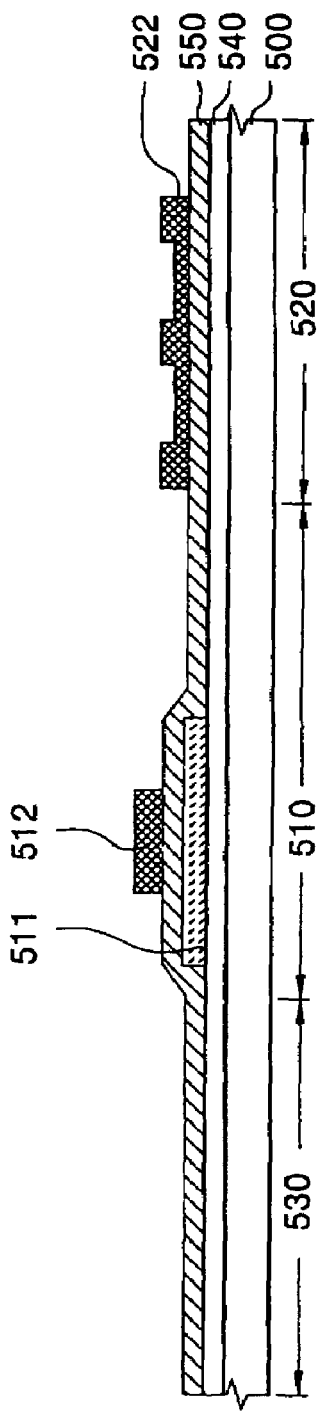

Referring to FIG. 5D, an ashing process is performed to remove the photoresist pattern 560 by a predetermined thickness until portions 522b of the first metal layer 501 over the second region 520 are exposed. The first metal layer 501 over the second region 520 is etched using the remaining photoresist pattern 560, thereby exposing the gate electrode 512 and forming a first capacitor electrode 522 as shown in FIG. 5E. The etching process is performed using a recipe having an excellent etching selectivity to the gate insulating layer 550.

The first capacitor electrode 522 has step portions 525 similarly configured as the step portions 425 which are as described above with reference to FIG. 4C and thus has an increased surface area size, leading to formation of a capacitor having a high capacitance.

Processes subsequent to the process described with reference to FIG. 5E are identical to those of FIGS. 4D and 4E, and description of the identical processes is omitted to avoid a redundancy.

In the third and fourth embodiments, a small number of step portions 425 and 525, respectively, are shown for purposes of illustration. In practice a greater number of step portions are formed in the first capacitor electrodes 422 and 522, respectively, where the greater number of step portions are determined by a construction of the mask 40.

Figure 6A:
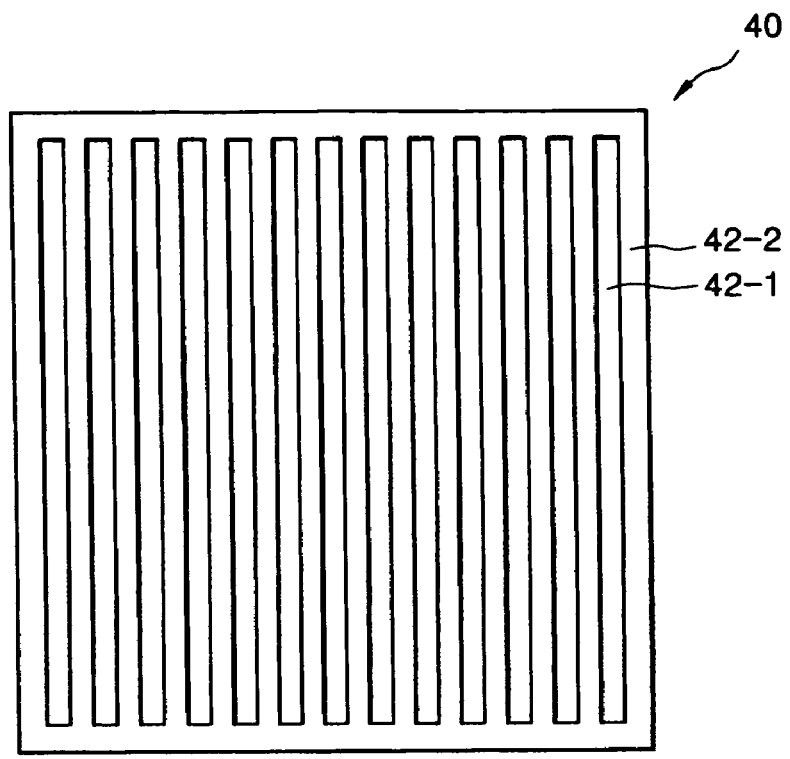
FIG. 6A shows a portion of a mask corresponding to a first capacitor electrode.

FIG. 6A shows a portion of the mask 40 corresponding to the first capacitor electrode 422. The light shielding material layers 42-1 and 42-2 are alternately formed in the form of a striped pattern.

Figure 6B:
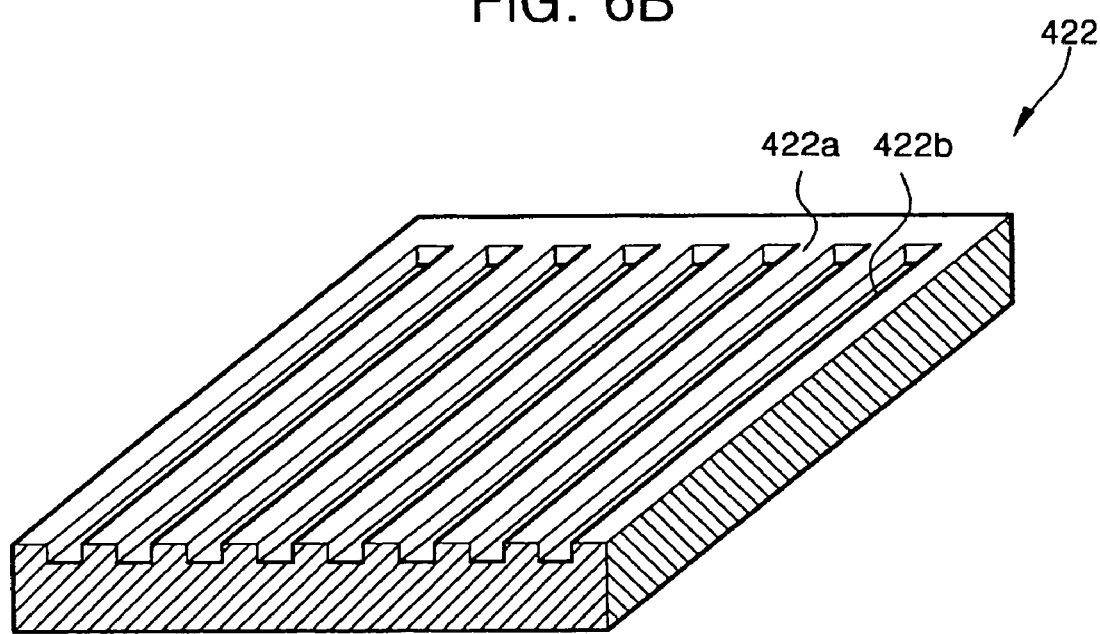
FIG. 6B shows the first capacitor electrode formed by using the mask of FIG. 6A.

FIG. 6B shows a cutaway view of the first capacitor electrode 422 formed by using the portion of the mask 40 as shown in FIG. 6A. The first capacitor electrode 422 comprises convex portions 422a (projections) and concave portions (grooves) 422b which are also alternately formed in the form of a striped pattern. The convex portions (projections) 422a and the concave portions (grooves) 422b have a rectangular cross-section.

Figure 7A:
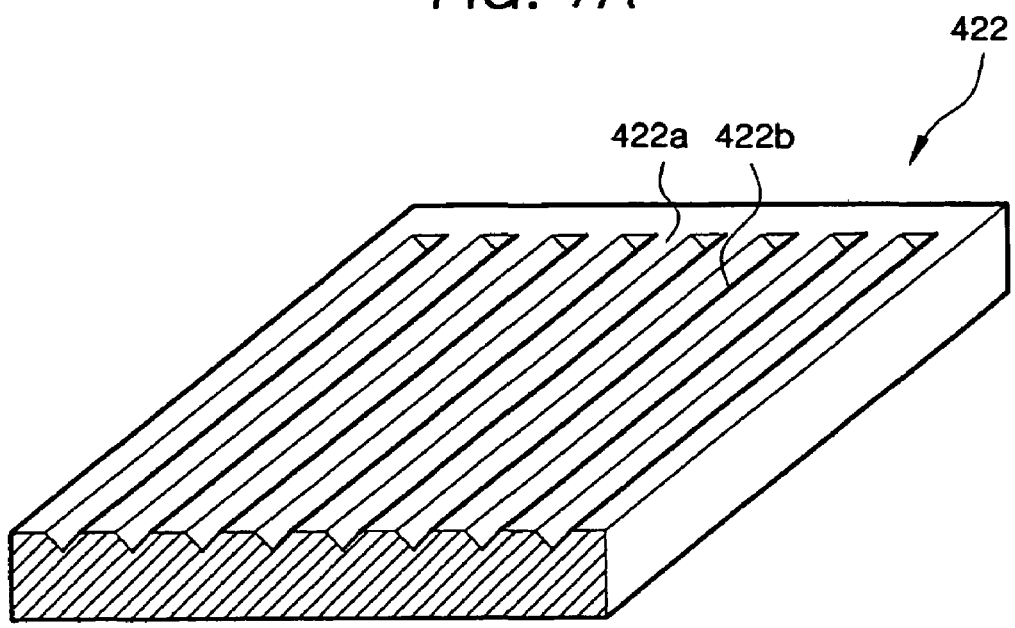
FIGS. 7A through 7C show modifications of the first capacitor electrode formed by using the mask of FIG. 6A.
Figure 7B:
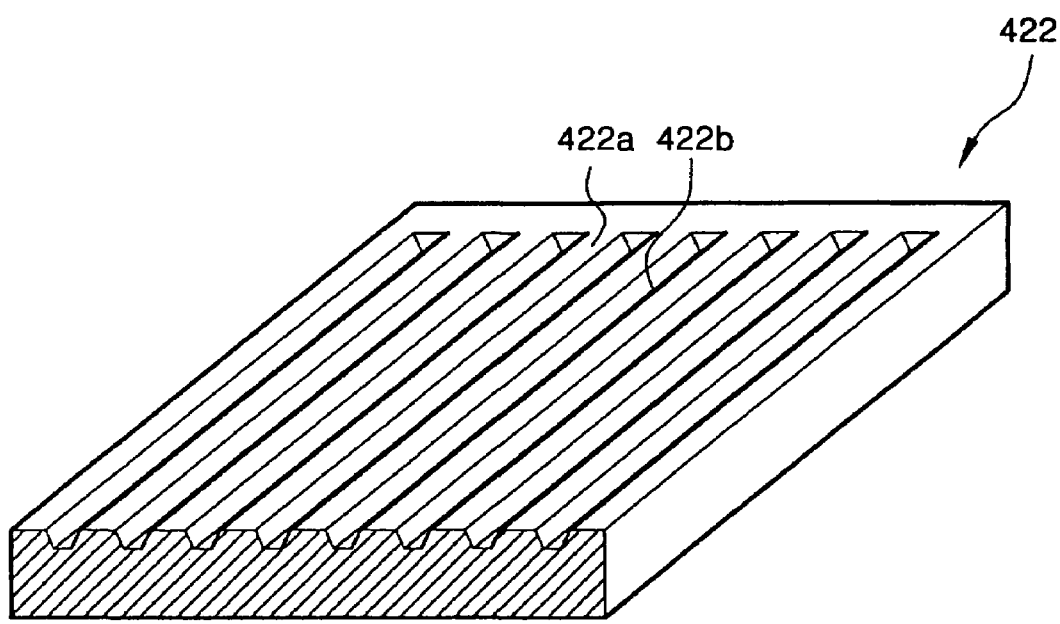
Figure 7C:
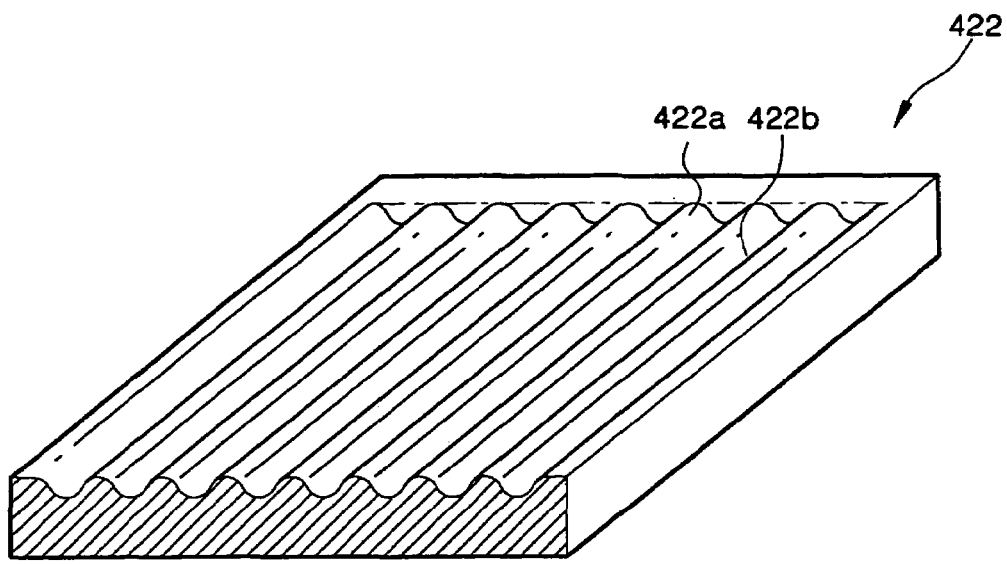

FIGS. 7A through 7C shows modifications of the first capacitor electrode 422 formed by using the portion of the mask 40 shown in FIG. 6A. The first capacitor electrode 422 comprises convex portions 422a and concave portions 422b which are also alternately formed in the form of a striped pattern. The concave portions 422b of FIG. 7A have a triangular cross-section. The concave portion 422b of FIG. 7B have a trapezoidal cross-section. The concave portion 422b of FIG. 7C has a wave-shaped cross-section.

The first capacitor electrode 422 of FIGS. 7A, 7B and 7C is formed by a wet-etching process or a dry-etching process using the mask 40. In case of a dry-etching process, a shape of the first capacitor electrode depends on a hard baking condition during a hard baking process and a bias condition during a dry etching process of the first metal layer 401. In other words, the first capacitor electrode 422 of FIGS. 7A, 7B and 7C is formed by varying a hard baking condition during a hard baking process and a bias condition, respectively during a dry etching process of the first metal layer 401.

The first capacitor electrode 422 having a cross-section as shown in FIGS. 7A, 7B and 7C prevents an electric field concentration and thus improves a dielectric breakdown characteristic compared with a dielectric breakdown characteristic of the first capacitor electrode 422 having a rectangular cross-section as shown in FIG. 6B.

Figure 8A:
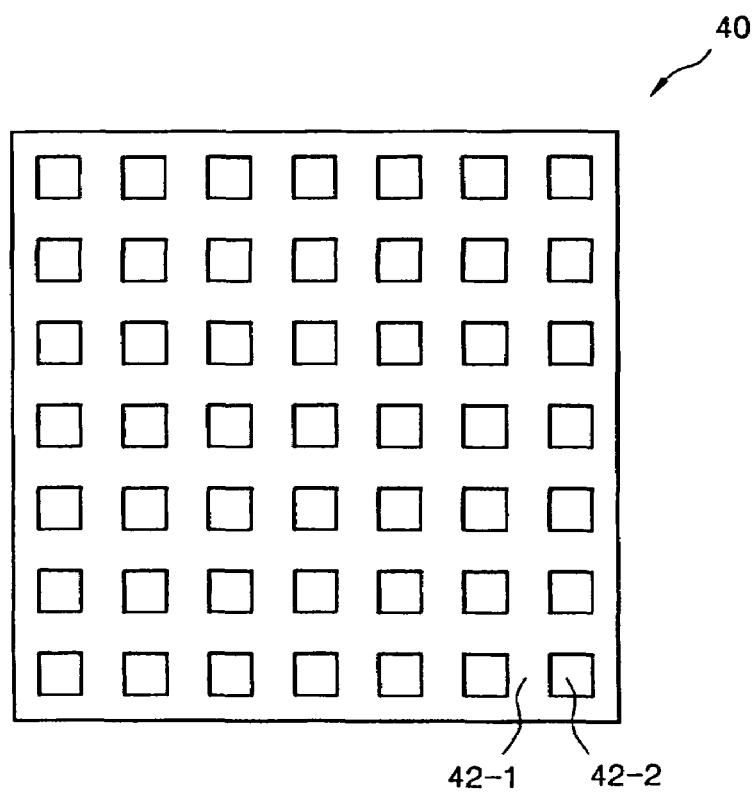
FIG. 8A shows a modification of the mask of FIG. 6A.
Figure 8B:
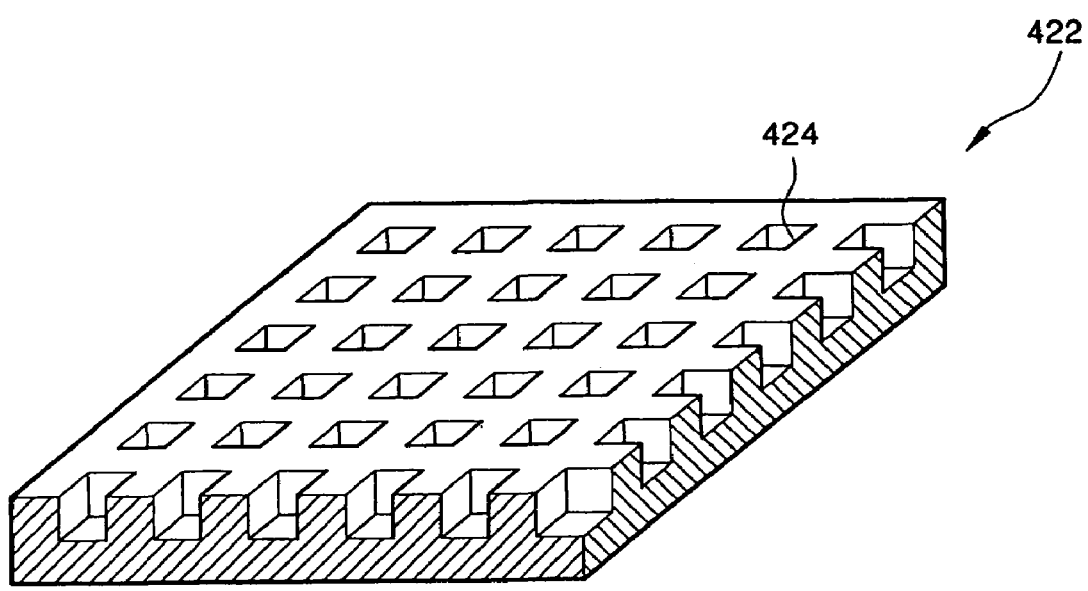
FIG. 8B shows the first capacitor electrode formed by the mask of FIG. 8A.

FIG. 8A shows a modification of a portion of the mask 40 which is used to form the first capacitor electrode 422. In the area of the first capacitor electrode 422, the light shielding material layer 42-1 is formed in the form of a grid, and the light shielding material layer 42-2 is formed as a plurality of dots arranged in a pattern with respect to the grid. FIG. 8B shows the first capacitor electrode 422 formed by the portion of the mask 40 shown in FIG. 8A. The first capacitor electrode 422 comprises a plurality of cavities 424 arranged in a pattern corresponding to the dots of the portion of the mask 40 shown in FIG. 8A. Each cavity 424 of the first capacitor electrode 422 of FIG. 8B also has a step portion 425 and thus the first capacitor electrode 422 has an increased surface area size, thereby increasing a capacitance of a capacitor formed with the first capacitor electrode 422. Thus, each of FIGS. 6B, 7A, 7B, 7C and 8B describes a first capacitor electrode 422 having a non-planar surface, thus increasing the capacitance of the capacitor due to an increased surface area.

Figure 9:
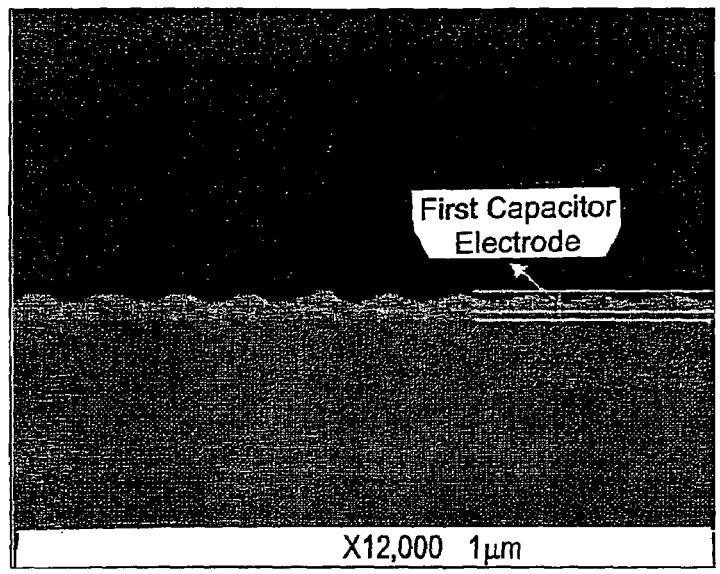
FIG. 9 shows a photograph of a section the first capacitor electrode formed by using the mask of FIG. 6A.
Figure 10:
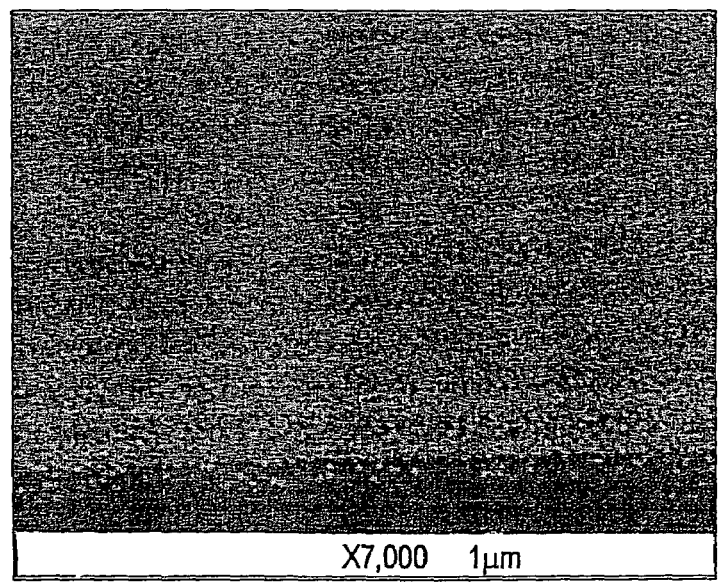
FIG. 10 shows a photograph of a plan view of the first capacitor electrode formed by using the mask of FIG. 6A.

FIGS. 9 and 10 show photographs of the first capacitor electrode 422 formed by using the half-tone mask. In FIGS. 9 and 10, the first capacitor electrode is made of a molybdenum-tungsten (MoW) alloy. Other suitable materials for the first capacitor electrode include, for example, aluminum or aluminum alloy. In FIGS. 9 and 10, the legends "X12,000" and "X7,000", respectively, denote a magnifying power and the legend "1 μm" denotes a scale.

As described above, the organic EL display device according to the present invention has the following advantages: since a dielectric layer of a capacitor is formed thinly through a single process and a surface area size of the capacitor is increased, a capacitance of the capacitor is increased. Therefore, an area size of the capacitor is reduced, and an aperture ratio is significantly increased.

Although the embodiments of the present invention are disclosed with reference to a p-type device, it will be appreciated by persons skilled in the art that the principles of the invention are also applicable to n-type devices. The source and drain of an n-type device, are respectively reversed in position from the source and drain positions shown in FIGS. 2A through 2D, 3A through 3E, 4D and 4E.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A flat panel display device, comprising
   a substrate including a thin film transistor region and a capacitor region, the thin film transistor region comprising a thin film transistor having a semiconductor layer, a gate electrode and source and drain electrodes, the capacitor region comprising a capacitor having first and second capacitor electrodes; and
   an insulating layer formed on the substrate comprising:
      a first portion of the insulating layer formed over the thin film transistor region insulating the gate electrode from the source and drain electrodes, and
      a second portion of the insulating layer formed over the capacitor region used as a dielectric layer between the first capacitor electrode and the second capacitor electrode, the first portion of the insulating layer formed over the thin film transistor region is formed of at least double layers and the second portion of the insulating layer formed over the capacitor region used as a dielectric layer between the first capacitor electrode and the second capacitor electrode is formed of a single layer.

2. A flat panel display device, comprising:
   a substrate comprising a thin film transistor region and a capacitor region;
   a semiconductor layer formed on the thin film transistor region;
   a gate insulating layer formed over a whole surface of the substrate and covering the semiconductor layer;
   a gate electrode formed on the gate insulating layer over the thin film transistor region;
   a first capacitor electrode formed on the gate insulating layer over the capacitor region;
   an interlayer insulating layer formed over the whole surface of the substrate and covering the gate electrode and the first capacitor electrode, wherein a portion of the interlayer insulating layer formed over the thin film transistor region is formed of at least double layers and a portion of the interlayer insulating layer formed over the capacitor region is formed of single layer, the interlayer insulating layer having contact holes exposing end portions of the semiconductor layer;
   source and drain electrodes formed on the interlayer insulating layer and contacting the end portions of the semiconductor layer through the contact holes, respectively; and
   a second capacitor electrode formed on the interlayer insulating layer over the capacitor region and electrically connected to one of the source and drain electrodes.

3. A method of manufacturing a flat panel display device, comprising:
   providing a substrate, the substrate comprising a thin film transistor region and a capacitor region;
   forming a semiconductor layer over the thin film transistor region;
   forming a gate insulating layer over a whole surface of the substrate to cover the semiconductor layer;
   forming a gate electrode and a first capacitor electrode on the gate insulating layer, the gate electrode formed over the thin film transistor region, the first capacitor electrode formed over the capacitor region;
   forming an interlayer insulating layer as at least double layers over a whole surface of the substrate to cover the gate electrode and the first capacitor electrode; and
   etching the interlayer insulating layer using a half-tone mask, a portion of the interlayer insulating layer over the thin film transistor region being etched to expose end portions of the semiconductor layer and a portion of the interlayer insulating layer over the capacitor region being etched by a predetermined thickness to remove a upper layer of the interlayer insulating layer.

4. A method of manufacturing a flat panel display device, comprising:
   providing a substrate, the substrate including a thin film transistor region and a capacitor region;
   forming a semiconductor layer over the thin film transistor region of the substrate;
   forming a gate insulating layer over the whole surface of the substrate to cover the semiconductor layer;
   forming a gate electrode and a first capacitor electrode on the gate insulating layer, the gate electrode formed over the thin film transistor region, the first capacitor electrode formed over the capacitor region;
   forming an interlayer insulating layer as at least double layers over the whole surface of the substrate to cover the gate electrode and the first capacitor electrode; and
   etching the interlayer insulating layer using a half-tone mask, a portion of the interlayer insulating layer over the thin film transistor region etched to expose both end portions of the semiconductor layer, a portion of the interlayer insulating layer over the capacitor region etched by a predetermined thickness to remove a upper layer of the double layer.

5. The method of claim 4, wherein the etching of the exposed portion of the interlayer insulating layer over the capacitor region is performed using a recipe having an etching selectivity to the semiconductor layer.

6. A flat panel display device, comprising:
   a substrate comprising a thin film transistor region and a capacitor region;
      a thin film transistor formed over the thin film transistor region and comprising a semiconductor layer, a gate electrode, source and drain electrodes, and an interlayer insulating layer formed on the whole substrate; and
   a capacitor comprising first and second capacitor electrodes, the first capacitor electrode having step portions,
   wherein the portion of the interlayer insulating layer formed over the thin film transistor region is formed of at least double layers and the portion of the interlayer insulating layer formed over the capacitor region used as a dielectric layer between the first capacitor electrode and the second capacitor electrode is formed of a single layer.

7. The device of claim 6, wherein the step portions of the first capacitor electrode are grooves formed in a striped pattern.

8. The device of claim 6, wherein each step portion of the first capacitor electrode is in the form of a cavity.

9. The device of claim 7, wherein the grooves have a rectangular cross-section, a triangle cross-section, a trapezoid cross-section, or a wave-shaped cross-section.

10. The device of claim 8, wherein the the cavities have a rectangular cross-section, a triangle cross-section, a trapezoid cross-section, or a wave-shaped cross-section.

11. A flat panel display device, comprising:
   a substrate comprising a thin film transistor region and a capacitor region;
   a semiconductor layer formed on the thin film transistor region;
   a gate insulating layer formed over a whole surface of the substrate and covering the semiconductor layer;
   a gate electrode formed on the gate insulating layer over the thin film transistor region;
   a first capacitor electrode formed on the gate insulation layer over the capacitor region of the substrate and having step portions;
   an interlayer insulating layer formed over the whole surface of the substrate and covering the gate electrode and the first capacitor electrode and having contact holes;
   source and drain electrodes formed on the interlayer insulating layer and contacting the end portions of the semiconductor layer through the contact holes, respectively; and
   a second capacitor electrode formed on the interlayer insulating layer over the capacitor region and electrically connected to one of the source and drain electrodes, wherein the portion of the interlayer insulating layer formed over the thin film transistor region is formed of at least double layers and the portion of the interlayer insulating layer formed over the capacitor region used as a dielectric layer between the first capacitor electrode and the second capacitor electrode is formed of a single layer.

12. The device of claim 11, wherein the first capacitor electrode comprises a plurality of grooves formed in a striped pattern or a plurality of cavities.

13. The device of claim 12, wherein each groove or cavity has a rectangular cross-section, a triangle cross-section, trapezoid cross-section, or a wave-shaped cross-section.

14. A method of manufacturing a flat panel display device, comprising:
   providing a substrate, the substrate having a thin film transistor region and a capacitor region;
   forming a semiconductor layer over the thin film transistor region forming a gate insulating layer over the whole surface of the substrate to cover the semiconductor layer;
   depositing a metal layer on the gate insulating layer;
   etching the metal layer using a half-tone mask to form a gate electrode over the thin film transistor region and to form a first capacitor electrode having step portions; and
   forming an interlayer insulating layer over a whole surface of the substrate to cover the gate electrode and the first capacitor electrode, wherein the portion of the interlayer insulating layer formed over the thin film transistor region is formed of at least double layers and the portion of the interlayer insulating layer formed over the capacitor region used as a dielectric layer between the first capacitor electrode and the second capacitor electrode is formed of a single layer.

15. The method of claim 14, wherein the step portions of the first capacitor electrode comprise grooves formed in a striped pattern or a plurality of cavities.

16. The device of claim 15, wherein each groove or cavity has a rectangular cross-section, a triangle cross-section, trapezoid cross-section, or a wave-shaped cross-section.

17. A method of manufacturing a flat panel display device, comprising:
   providing a substrate, the substrate comprising a thin film transistor region and a capacitor region;
   forming a semiconductor layer over the thin film transistor region of the substrate;
   forming a gate insulating layer over a whole surface of the substrate to cover the semiconductor layer;
   depositing a metal layer on the gate insulating layer;
   coating a photoresist on the metal layer;
   patterning the photoresist using a half-tone mask to form first and second photoresist patterns, the first photoresist pattern formed over the thin film transistor region and exposing a portion of the gate insulating layer, the second photoresist pattern formed over the capacitor region and having step portions;
   etching the metal layer using the first and second photoresist patterns to form a gate electrode;
   ashing the photoresist patterns to expose a portion of the metal layer over the capacitor region;
   etching the exposed portion of the metal layer over the capacitor region using a remaining portion of the photoresist patterns to form a first capacitor electrode having step portions;
   forming an interlayer insulating layer as at least double layers over the whole surface of the substrate and covering the gate electrode and the first capacitor electrode; and
   etching the interlayer insulating layer using a half-tone mask, a portion of the interlayer insulating layer over the thin film transistor region etched to expose both end portions of the semiconductor layer, a portion of the interlayer insulating layer over the capacitor region etched by a predetermined thickness to remove a upper layer of the double layer.

18. The method of claim 17, wherein the etching of the metal layer is performed using a recipe having an excellent etching selectivity to the gate insulating layer.

19. A flat panel display device, comprising:
a substrate;
a thin film transistor having source, drain and gate electrodes formed on the substrate;
a capacitor having first and second electrodes formed on the substrate, the second capacitor electrode commonly connected with the source electrode;
an insulating layer comprising:
  a first portion which insulates the gate electrode from the source and drain electrodes, and
  a second portion which is interposed between the first and second capacitor electrodes to form a dielectric for the capacitor, wherein the first portion of the insulating layer is formed of at least double layers and the second portion of the insulating layer is formed of a single layer.

20. The flat panel display device of claim 19, wherein the first and second electrodes of the capacitor and the dielectric have a non-planar shape.

21. A method of manufacturing a flat panel display device on a substrate, the method comprising:
forming a semiconductor layer over a first portion of the substrate;
forming a first insulating layer over the semiconductor layer and the substrate;
forming a gate electrode over a portion of the semiconductor layer and a first capacitor electrode over a second portion of the substrate;
forming a second insulating layer at least double layers over the gate electrode and the first capacitor electrode;
etching an area of the second insulating over the first capacitor electrode to form single layer, an area of the second insulating area over the gate electrode to form at least double layers and an area over the source and drain electrodes to expose the source and drain electrodes; and
forming a second capacitor electrode over the area of the second insulating layer having the first thickness.

22. The method of claim 21, further comprising:
etching the first capacitor electrode to form a non-planar surface on which the second insulating layer is formed.

23. The method of claim 22, wherein the etching of the first capacitor electrode comprises:
coating the first capacitor electrode with a photoresist material;
exposing the photoresist material to light using a mask which partially transmits incident light in a first plurality of areas and does not transmit light in a second plurality of areas;
etching the exposed area using a dry etching process wherein a hard baking condition of a hard baking process is controlled during the etching.

24. The method of claim 22, wherein the etching of the first capacitor electrode comprises:
coating the first capacitor electrode with a photoresist material;
exposing the photoresist material to light using a mask which partially transmits incident light in a first plurality of areas and does not transmit light in a second plurality of areas;
etching the exposed area using a wet etching process wherein a bias condition is controlled during the etching.

* * * * *